United States Patent
Bao

(10) Patent No.: US 9,912,293 B2
(45) Date of Patent: Mar. 6, 2018

(54) SUB-HARMONIC MIXER AND A METHOD THEREIN FOR CONVERTING RADIO FREQUENCY SIGNALS TO INTERMEDIATE FREQUENCY SIGNALS

(71) Applicant: TELEFONAKTIEBOLAGET LM ERICSSON (PUBL), Stockholm (SE)

(72) Inventor: Mingquan Bao, Västra Frölunda (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 15/039,626

(22) PCT Filed: Dec. 2, 2013

(86) PCT No.: PCT/EP2013/075288
§ 371 (c)(1),
(2) Date: May 26, 2016

(87) PCT Pub. No.: WO2015/081983
PCT Pub. Date: Jun. 11, 2015

(65) Prior Publication Data
US 2017/0025999 A1    Jan. 26, 2017

(51) Int. Cl.
*G06G 7/12* (2006.01)
*G06G 7/44* (2006.01)
*H03D 7/16* (2006.01)
*H03D 7/12* (2006.01)

(52) U.S. Cl.
CPC ............. *H03D 7/163* (2013.01); *H03D 7/12* (2013.01); *H03D 7/125* (2013.01)

(58) Field of Classification Search
CPC .. H03D 7/1458; H03D 7/1466; H03D 7/1475; H03D 7/1483; H03D 7/1491

USPC .......... 327/355–360, 560–563; 455/323, 326
See application file for complete search history.

(56) References Cited

U.S. PATENT DOCUMENTS

| 4,864,636 | A | 9/1989 | Brunius |
| 5,301,361 | A | 4/1994 | Koike |
| 6,351,632 | B1* | 2/2002 | Yan .......................... H04B 1/28 327/355 |
| 6,704,558 | B1 | 3/2004 | Sorrells et al. |
| 6,901,249 | B1* | 5/2005 | Kobayashi ............. H03D 7/125 455/190.1 |

(Continued)

FOREIGN PATENT DOCUMENTS

CN    102522953 A  * 12/2011

OTHER PUBLICATIONS

Xiaoxi Ning, et al. A 79 GHz Sub-Harmonic Mixer Design Using a 1 um InP DHBT Technology. Microwave and Millimeter Wave Technology, 2012 International Conference on. IEEE. May 5, 2012.

*Primary Examiner* — Dinh T Le

(57) ABSTRACT

A sub-harmonic mixer two or more cascaded stages for converting a Radio Frequency signal to an Intermediate Frequency signal. Each stage comprises a common-emitter transistor or a common-source transistor and each stage having an input and an output, the output of each stage is coupled to the input of a next stage by a capacitor. An Alternating Current choke is coupled at a collector or drain of each transistor. An LO input is coupled to the input of a first stage of the two or more stages; an RF input is coupled to the output of the first stage of the two or more stages; and an IF output is coupled to the output of a last stage of the two or more stages.

14 Claims, 9 Drawing Sheets

(56) References Cited

U.S. PATENT DOCUMENTS

| | | | | |
|---|---|---|---|---|
| 7,084,693 B2* | 8/2006 | Romano | ............... | H04B 1/28 |
| | | | | 327/355 |
| 8,164,395 B2* | 4/2012 | Kobayashi | ............... | H03C 1/36 |
| | | | | 332/106 |
| 9,478,204 B2* | 10/2016 | Bao | ............... | H03D 7/02 |

* cited by examiner

SUB-HARMONIC MIXER AND A METHOD THEREIN FOR CONVERTING RADIO FREQUENCY SIGNALS TO INTERMEDIATE FREQUENCY SIGNALS

TECHNICAL FIELD

Embodiments herein relate to a sub-harmonic mixer and a method therein. In particular, it relates to a sub-harmonic mixer for converting radio frequency signals to intermediate frequency signals in a wireless communication device.

BACKGROUND

Wireless communication devices usually comprise wireless receivers and transmitters. A down-conversion mixer is an important building block in a wireless receiver, which converts a high Radio Frequency (RF) $f_{RF}$ signal to an Intermediate Frequency (IF) $f_{IF}$ signal by virtue of a Local Oscillator (LO) $f_{LO}$ signal. The output of the mixer is an IF signal, and its frequency is given by $f_{IF}=|f_{RF}-nf_{LO}|$ where n is an integer.

If n=1, the IF signal is obtained by mixing the RF signal with the 1st harmonic of the LO signal, such kind of mixer is called a fundamental mixer; if n≠1, the IF signal is obtained by mixing the RF signal with the n-th order harmonic of the LO signal, such kind of mixer is called a xn sub-harmonic mixer.

The sub-harmonic mixer is driven by a low frequency LO signal. For example, an x2 sub-harmonic mixer requires an LO signal having a frequency of a half of that for a fundamental mixer. If a fundamental mixer is used for a receiver operating at a RF frequency above 140 GHz, a signal source with a frequency around 140 GHz is needed. Unfortunately, such a signal source is not commercially available. One solution is using a frequency multiplier together with a low frequency signal source. Another solution is using a sub-harmonic mixer.

Furthermore, the larger the number n is, i.e. the n-th order harmonic of the LO signal, the lower the LO signal frequency is. A low frequency signal source usually has a better phase noise performance than that of a high frequency one, because the quality factor Q of the resonator increases as the frequency decreases. Consequently, a high-order (n≥4) sub-harmonic mixer is desired, especially, in the case that the RF frequency is larger than 140 GHz.

In ELLIS, Thomas J. et al., A Planar Circuit Design for High Order Sub-harmonic Mixers, *Microwave Symposium Digest, IEEE MTT-S International*, 1997, an x5 sub-harmonic mixer with a single diode is disclosed. This x5 sub-harmonic mixer has a conversion loss of 15 dB with an LO signal power of 12 dBm.

In KANAYA, K. et al., A 94 GHz High Performance Quadruple Subharmonic Mixer MMIC, *Microwave Symposium Digest, IEEE MTT-S International*, 2002, a sub-harmonic mixer with an anti-parallel diode pair is designed and characterized. It has a conversion loss of 9.2 dB with an LO signal power of 5 dBm, when operating with the 2nd order harmonic of the LO signal, and it has a conversion loss of 11 dB with an LO signal power of 10 dBm, when operating with the 4th order harmonic of the LO signal.

U.S. Pat. No. 4,320,536 discloses a sub-harmonic pumped mixer circuit utilizes quarter wavelength transmission lines at an LO frequency to provide high RF to LO port isolation while allowing the RF and LO ports, as well as an IF port, to be connected directly to a semiconductor switch. A transmission line suppressor network connected between the semiconductor switch and the RF port allows operation at any selected even LO harmonic by suppressing response to even harmonics of the LO frequency below the selected harmonic and includes transmission line suppressors which are each a quarter wavelength at the frequency to be suppressed.

In LIU, Zhiyang et al., High-Order Subharmonically Pumped Mixers Using Phased Local Oscillators, *IEEE Trans. Microw. Theory Tech.* July 2006, vol. 54, no. 7, pp. 2977-2982, an x8 sub-harmonic based on two anti-parallel diode pairs is disclosed, which has a conversion loss of 8 dB with an LO signal power of 12.5 dBm.

Other kinds of sub-harmonic mixers, as shown in FIG. 1, are Gilbert type mixers, where emitter-coupled pairs driven by differential LO signals are either in parallel or stacked, to enhance the 2nd LO harmonic and suppress the 1st harmonic. For example, in TSAI, J.-H. et al., 35-65 GHz CMOS Broadband Modulator and Demodulator with Sub-harmonic Pumping for MMW Wireless Gigabit Applications, *IEEE Trans. Microw. Theory Tech.*, October 2007, vol. 55, no. 10, pp. 2075-2085, an x2 sub-harmonic mixer (Gilbert type) is disclosed and has a conversion loss about 6 dB with an LO signal power of 7 dBm; in SHENG, L., et al., A Wide-bandwidth Si/SiGe HBT Direct Conversion Sub-harmonic mixer/Downconverter, *IEEE Journal of Solid-State Circuits*, September 2000, vol. 35, no. 9, pp. 1329-1337, an x2 sub-harmonic mixer is described and it achieves a conversion gain of 12.6 dB with an LO signal power of 10 dBm; and in U.S. Pat. No. 6,810,242, a sub-harmonic is disclosed which uses two stacks of switching cores with high order symmetry to reduce unwanted harmonic generation and uses Complementary Metal-Oxide Semiconductor (CMOS) transistors to improve headroom.

Another kind of sub-harmonic mixer is shown in FIG. 2, where the LO signal is applied at the gate/base of the transistor and the RF signal is applied at either the drain or the base. Such kind of mixer is called as "gate mixer". In GUNNARSSON, Sten E., Analysis and Design of a Novel 4 Subharmonically Pumped Resistive HEMT Mixer, *IEEE Trans. Microw. Theory Tech.*, April 2008, vol. 56, no. 4, an x4 sub-harmonic mixer is shown, which has a conversion loss of 15 dB with an LO signal power of 8 dBm. In MAO, Yanfei, et al., 245-GHz LNA, Mixer, and Subharmonic Receiver in SiGe Technology, *IEEE Trans. Microw. Theory Tech.*, 2012, vol. 60, no. 12, pp. 3823-3833, an x4 sub-harmonic mixer is described and it has a conversion loss of 5 dB.

In WINKLER, S. A. et al., Ultra-high-order Self-oscillating Mixers Based on Multiple-element Technique, *Electronics Letters*, December 2009, vol, 45, no. 25, an x6 sub-harmonic mixer integrated with an oscillator (self-oscillating mixer) is demonstrated. The mixer achieves a conversion gain of 2.8 dB.

Finally, in NING, Xiaoxi, et al., A 79 GHz Sub-harmonic Mixer Design Using a 1 um InP DHBT Technology, *International Conference on Microwave and Millimeter Wave Technology (ICMMT)*, 2012, a sub-harmonic mixer is described which has a frequency multiplier, where the LO signal is applied at an input of a frequency doubler. At the output port of the frequency doubler, the 1st order of the LO signal is suppressed by a quarter wavelength open stab.

The sub-harmonic mixer utilizing diodes as described above has a conversion loss and needs an LO signal power larger than 5 dBm. Even though a Gilbert type sub-harmonic mixer has potential to get a positive conversion gain, the Gilbert type sub-harmonic mixers, as well as most of the gate mixers need an LO power divider and phase shifter which is built by either transmission lines or lumped components such as resistors and capacitors. The power divider/phase shifter has a certain frequency bandwidth, which limits the frequency bandwidth of the mixer, and furthermore, the losses of the power divider/phase shifter increases the LO power consumption. If a frequency multiplier is utilized in the sub-harmonic mixer, it will cause extra power consumption.

SUMMARY

Therefor it is an object of embodiments herein to provide a sub-harmonic mixer with improved performance.

According to a first aspect of embodiments herein, the object is achieved by a sub-harmonic mixer for converting an RF signal to an IF signal.

The sub-harmonic mixer comprises an LO input to receive an LO signal; an RF input to receive the RF signal and an IF output to output the IF signal.

The sub-harmonic mixer further comprises two or more cascaded stages, each stage having an input and an output. The output of each stage is coupled to the input of a next stage by a capacitor. Each stage comprises a common-emitter transistor having a base, a collector and an emitter. Alternatively, each stage comprises a common-source transistor having a gate, a drain and a source. The input of each stage is at the base or gate of the transistor, the output of each stage is at the collector or drain of the transistor.

Further, an Alternating Current Chock is coupled at the collector or drain of each transistor, the emitter or source of each transistor is coupled together to a ground.

Further, the LO input is coupled to the input of a first stage of the two or more stages; the RF input is coupled to the output of the first stage of the two or more stages; and the IF output is coupled to the output of a last stage of the two or more stages.

According to a second aspect of embodiments herein, the object is achieved by a method in a sub-harmonic mixer for converting an RF signal to an IF signal. The sub-harmonic mixer comprises two or more cascaded stages each stage having an input and an output, the output of each stage is coupled to the input of a next stage by a capacitor.

The sub-harmonic mixer receives an LO signal at an input of a first stage of the two or more cascaded stages and receives the RF signal at an output of the first stage.

The sub-harmonic mixer then amplifies the LO signal and generates LO harmonic signals in the first stage.

The sub-harmonic mixer further generates a first IF signal by mixing the RF signal with one of generated LO harmonic signal in the first stage.

The sub-harmonic mixer then amplifies the generated first IF signal in stages of the two or more cascaded stages following the first stage.

The sub-harmonic mixer further generates a second IF signal by mixing the RF signal with one of the generated LO harmonic signal in the stages of the two or more cascaded stages following the first stage.

The sub-harmonic mixer then generates the IF signal by combining the amplified first IF signal and the generated second IF signal at an output of a last stage of the two or more cascaded stages.

Finally, the sub-harmonic mixer outputs the generated IF signal to an IF output.

The sub-harmonic mixer according to embodiments herein has several advantages:

First, since the LO signal is amplified in the first stage, the conversion gain at the following stages is improved and the LO power consumption is reduced. This is because the conversion gain increases with the increasing LO signal power, as long as the LO signal power is below a certain value.

Second, the IF signal is obtained with different mechanisms and combined at the last stage of the sub-harmonic mixer, the overall conversion gain is enhanced.

Third, since baluns, 90 hybrids and phase shifters are not needed, the sub-harmonic mixer according to embodiments herein has a broad bandwidth.

Thus, embodiments herein provide a sub-harmonic mixer with improved performance in conversion gain, power consumption and bandwidth.

BRIEF DESCRIPTION OF THE DRAWINGS

Examples of embodiments herein are described in more detail with reference to attached drawings in which:

FIG. 9 is a schematic block diagram illustrating a wireless communication device in which embodiments herein may be implemented in.

DETAILED DESCRIPTION

Figure 1:
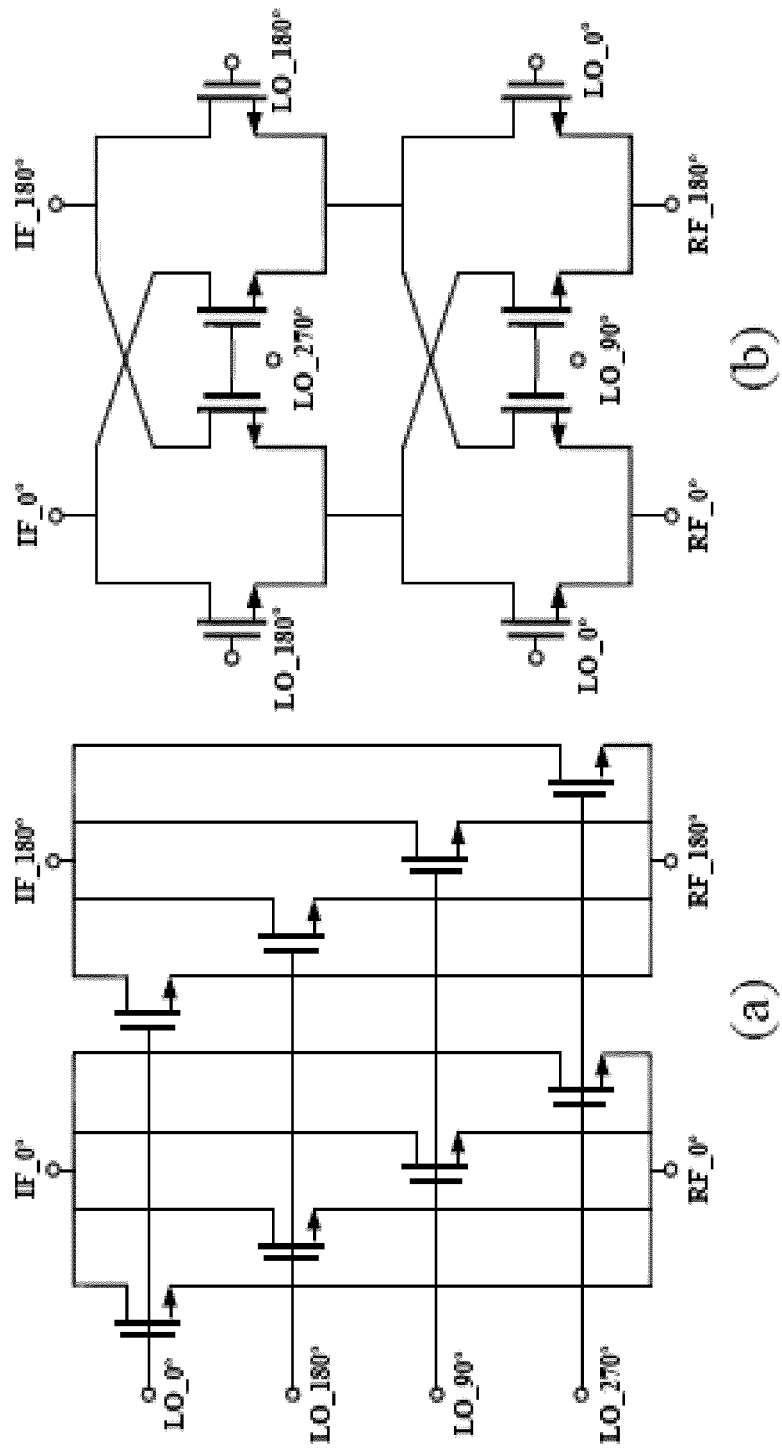
FIG. 1 is a schematic diagram illustrating a sub-harmonic mixer based on emitter coupled pairs.
Figure 2:
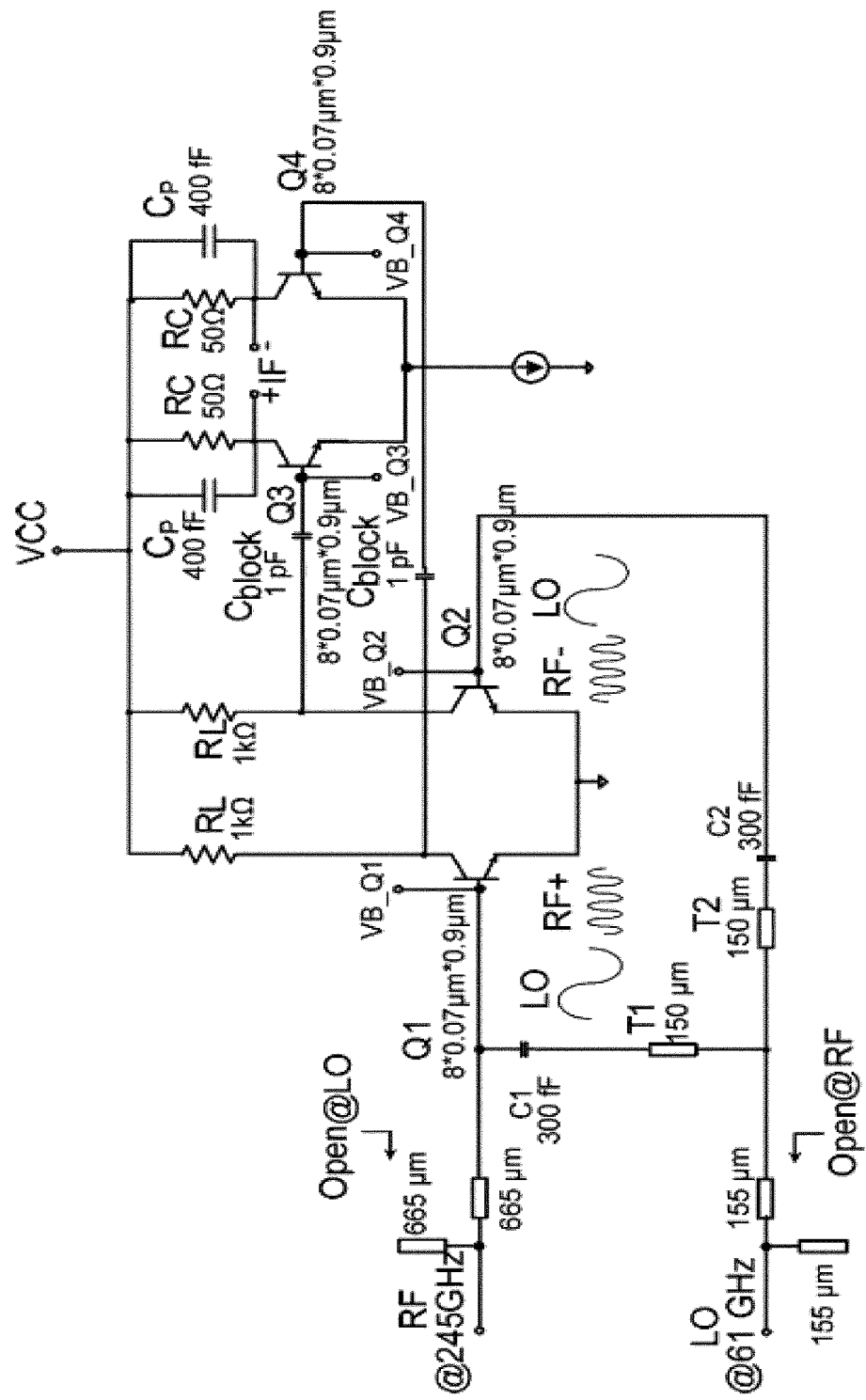
FIG. 2 is a schematic diagram illustrating an x4 sub-harmonic mixer.
Figure 3:
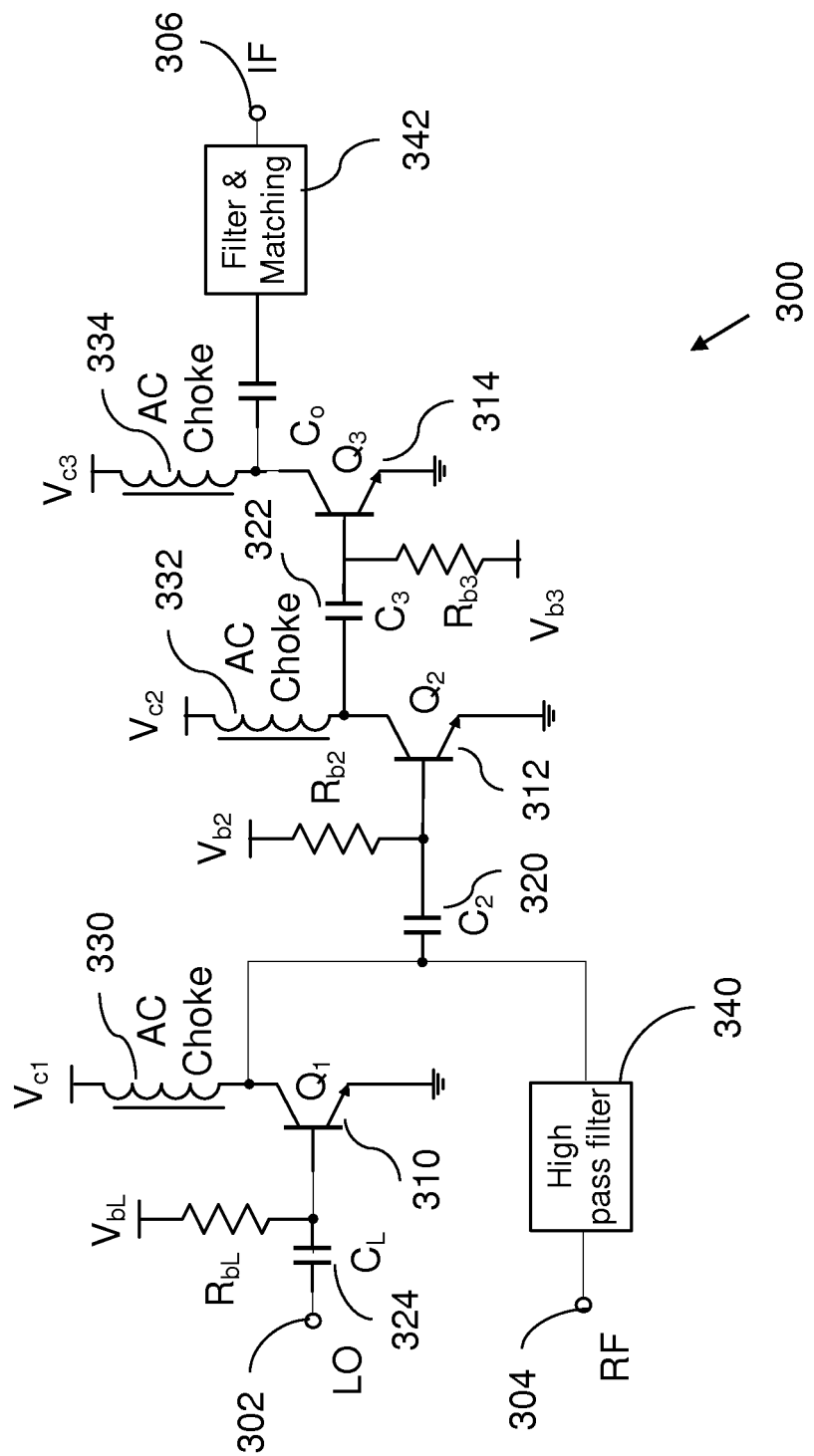
FIG. 3 is a schematic diagram illustrating a sub-harmonic mixer according to one embodiment.

According to one embodiment herein, a sub-harmonic mixer comprising three cascaded stages is shown in FIG. 3. Those skilled in the art will understand that a sub-harmonic mixer comprising two cascaded stages or more than three cascaded stages is also possible.

As shown in FIG. 3, the sub-harmonic mixer 300 comprises an LO input 302 to receive an LO signal; an RF input 304 to receive the RF signal and an IF output 306 to output the IF signal.

The sub-harmonic mixer 300 further comprises three cascaded stages 310, 312, 314, each stage having an input and an output, the output of each stage is coupled to the input of a next stage by a capacitor. For example, the output of the stage 310 is coupled to the input of the stage 312 by a capacitor 320; the output of the stage 312 is coupled to the input of the stage 314 by a capacitor 322. Each stage 310, 312, 314 comprises a common-emitter transistor $Q_1$, $Q_2$, $Q_3$, having a base, a collector and an emitter. Alternatively, each stage 310, 312, 314 may comprise a common-source transistor having a gate, a drain and a source.

The input of each stage is at the base or gate of the transistor, the output of each stage is at the collector or drain of the transistor.

Further, as shown in FIG. 3, the collector or drain of each transistor is coupled to Direct Current (DC) supplies $V_{c1}$, $V_{c2}$ and $V_{c3}$ through Alternating Current Chocks 330, 333, 334 respectively, the emitter or source of each transistor is connected to a ground.

According to some embodiments, the LO input 302 is coupled to the input of the first stage 310 through a capacitor 324; the RF input 304 is coupled to the output of the first stage 310 through a high-pass filter 340; and the IF output 306 is coupled to the output of the last stage 314 through a low-pass filter and matching network 342.

According to some embodiments, the base or gate of each transistor is coupled to DC supplies $V_{bL}$, $V_{b2}$ and $V_{b3}$, through resistors $R_{bL}$, $R_{b2}$ and $R_{b3}$ respectively.

Figure 4:
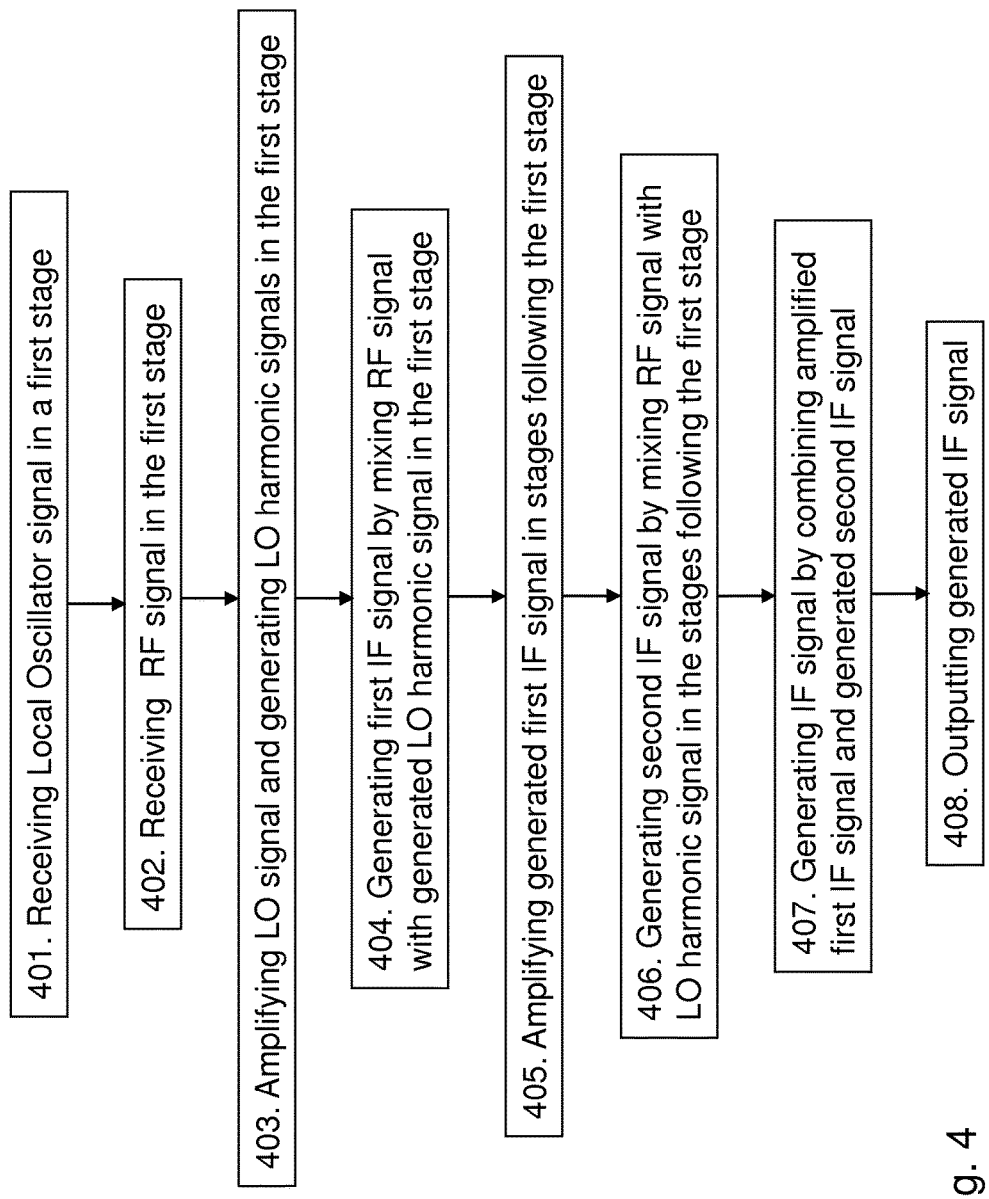
FIG. 4 is a flowchart depicting a method in a sub-harmonic mixer according to one embodiment.

In order to understand the principle of the sub-harmonic mixer 300 as shown in FIG. 3, a method on how to convert an RF signal to an IF signal in the sub-harmonic mixer 300 will now be described with reference to FIG. 4. As mentioned above, the sub-harmonic mixer 300 comprises three cascaded stages, each stage has different functions and will be described as performing different actions.

The first stage 310 of the sub-harmonic mixer performs the following actions:

Action 401

The first stage 310 of the sub-harmonic mixer receives a Local Oscillator, LO, signal at an input of the first stage 310.

Action 402

The first stage 310 of the sub-harmonic mixer receives the RF signal at an output of the first stage 310.

Action 403

The first stage 310 of the sub-harmonic mixer amplifies the LO signal and generates LO harmonic signals.

Action 404

The first stage 310 of the sub-harmonic mixer generates a first IF signal by mixing the RF signal with one of generated LO harmonic signal.

Figure 5:
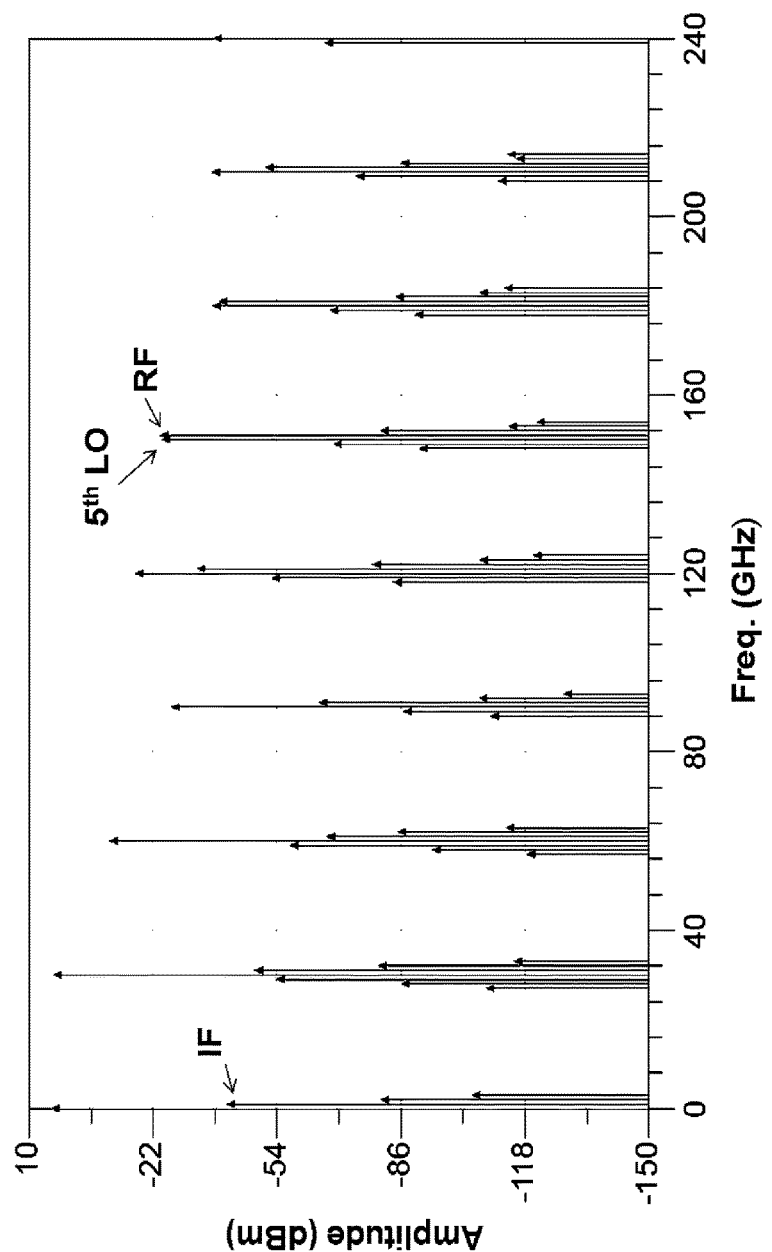
FIG. 5 is a diagram illustrating a spectrum of an output signal at the output of a first stage of the sub-harmonic mixer shown in FIG. 3.

Therefore, the first stage 310 works as a "gate/base mixer" and has multi-functions. First, it amplifies the LO signal and generates harmonic signals of the LO signal. This is illustrated in FIG. 5 which shows a spectrum of an output signal at the output of the first stage 310. For example, for an LO signal, $f_{LO}$=30 GHz and an RF signal, $f_{RF}$=151 GHz, it will generates a 5th order LO harmonic signal which is 150 GHz. Second, it mixes the 5th order LO harmonic signal and the RF signal and generates a desired IF signal which will be amplified by following cascaded stages. For example, the generated desired IF signal is $f_{IF}=|f_{RF}-5*f_{LO}|=1$ GHz, so the sub-harmonic mixer herein is an x5 sub-harmonic mixer. Third, since the RF signal is received at the output of the first stage 310, it prevents the RF signal from leaking to the LO input, therefore RF to LO input isolation is obtained.

The second stage 320 and the third or last stage 330 of the sub-harmonic mixer perform the following actions, referring again to FIG. 4:

Action 405

The second stage 320 and the third/last stage 330 amplify the generated first IF signal.

Action 406

The second stage 320 and the third or last stage 330 generate a second IF signal by mixing the RF signal with one of the generated LO harmonic signal.

The third/last stage 330 of the sub-harmonic mixer further performs the following actions:

Action 407

The third/last stage 330 generates the IF signal by combining the amplified first IF signal and the generated second IF signal at an output of the last stage 330.

Action 408

The third/last stage 330 outputs the generated IF signal to an IF output.

It can be understood from above description that the IF signal is obtained with different mechanisms. First, the RF and one of the generated LO harmonic signal are mixed in the first stage 310 to generate a first IF signal. Second, the RF signal and generated LO harmonics are mixed in the stages following the first stage, such as in the second and the third stages of the sub-harmonic mixer according to embodiments herein, to generate a second IF signal. The generated first IF signal is also amplified by the following stages. Then, the generated and amplified first IF signal is combined with the generated second IF signal. Combining or adding the IF signal generated from the different mechanisms, the conversion gain is enhanced. Therefore, the example sub-harmonic mixer herein has a positive conversion gain, even when it operates at high-order LO harmonics, and is driven by a low LO signal power. For example, for the LO signal, $f_{LO}$=30 GHz with power 1.5 dBm and the RF signal, $f_{RF}$=151 GHz with power −20 dBm, the generated IF signal $f_{IF}$=1 GHz has a power of −13.8 dBm, thus the sub-harmonic mixer according to embodiments herein has a conversion gain of 6.2 dB.

In order to show the importance of the mixing function of the first stage 310, an experiment is carried out. The IF signal generated by the first stage 310 is taken away deliberately, by using a shunted LC series resonator resonating at IF frequency, such as 1 GHz. One terminal of the LC series resonator is connected with the collector/drain of the transistor Q1, and the other terminal is grounded. In this way, the IF signal is filtered out, because the resonator has a very low impedance at 1 GHz. The x5 sub-harmonic mixer conversion gain with the resonator becomes 0.33 dB which is about 6 dB lower than that of without the resonator. This result confirms that the mixing component, i.e., the first IF signal, generated in the first stage 310 contributes to the overall conversion gain of the whole sub-harmonic mixer circuit.

Figure 6:
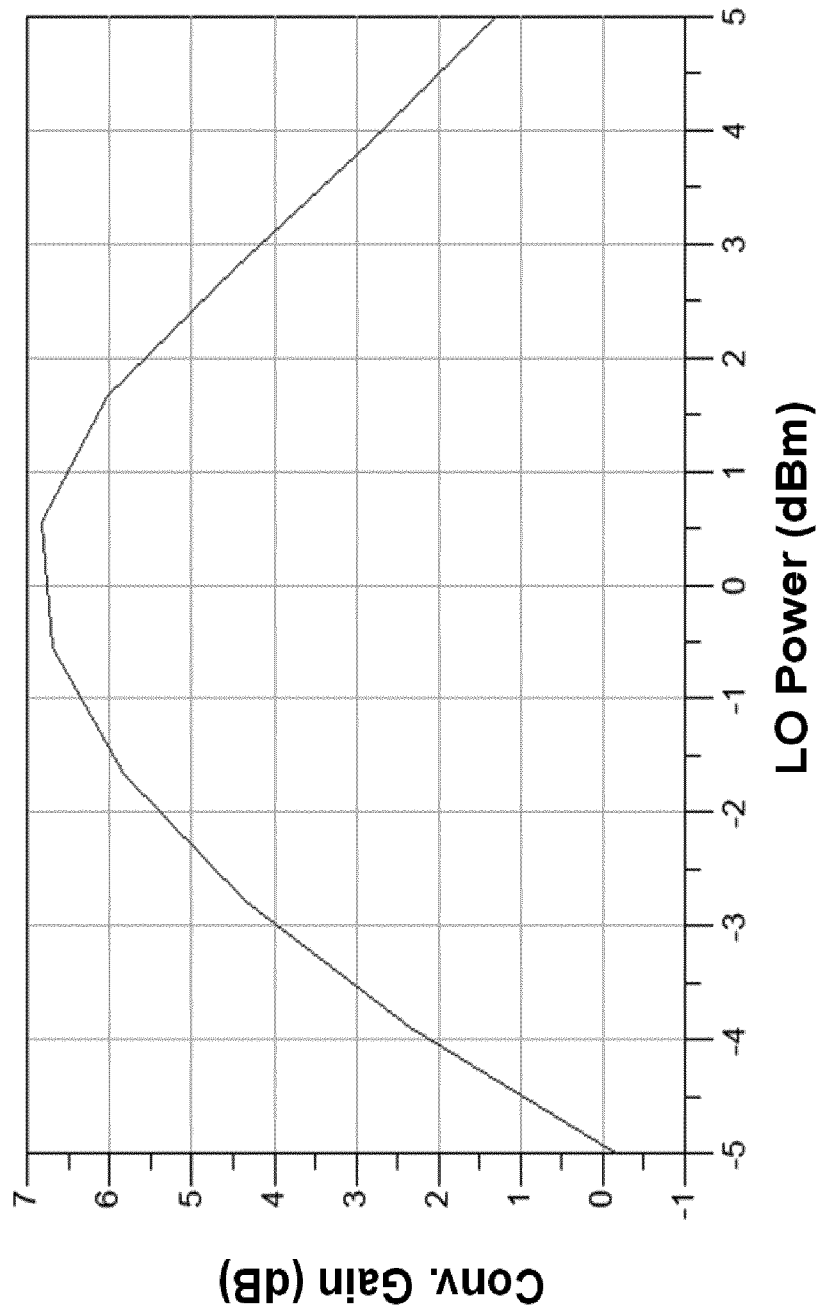
FIG. 6 is a diagram showing conversion gain versus LO signal power for the sub-harmonic mixer shown in FIG. 3.

The LO signal is applied at the input of the first stage 310, so the first stage 310 also amplifies the input LO signal, which improves the conversion gain because the conversion gain increases with the increasing LO signal power, as long as the LO signal power is below a certain value. In other words, the first stage 310 helps to reduce the LO power consumption. FIG. 6 shows the conversion gain of the whole sub-harmonic mixer as a function of the LO signal power, where $f_{IF}$=1 GHz, $f_{LO}$=30 GHz and $f_{RF}$=151 GHz. When the LO signal power is −4.8 dBm, a positive conversion gain for an x5 sub-harmonic is achieved. When the LO signal power is 0.55 dBm, the conversion gain has a maximum value of 6.8 dB.

As shown in FIG. 3, the RF signal is applied at the output of the first stage 310 through the high pass filter 340 which allows the high frequency RF signal to go through but prevents the leakage of the LO signal to the RF input. Further, the low-pass filter and matching network 342 is coupled between the IF output and the output of the third stage. The low-pass filter and matching network 342 has a function of impedance matching and a function of suppressing undesired RF and LO signals and their harmonic signals, as well as other mixing components, except the desired IF signal component.

Figure 7:
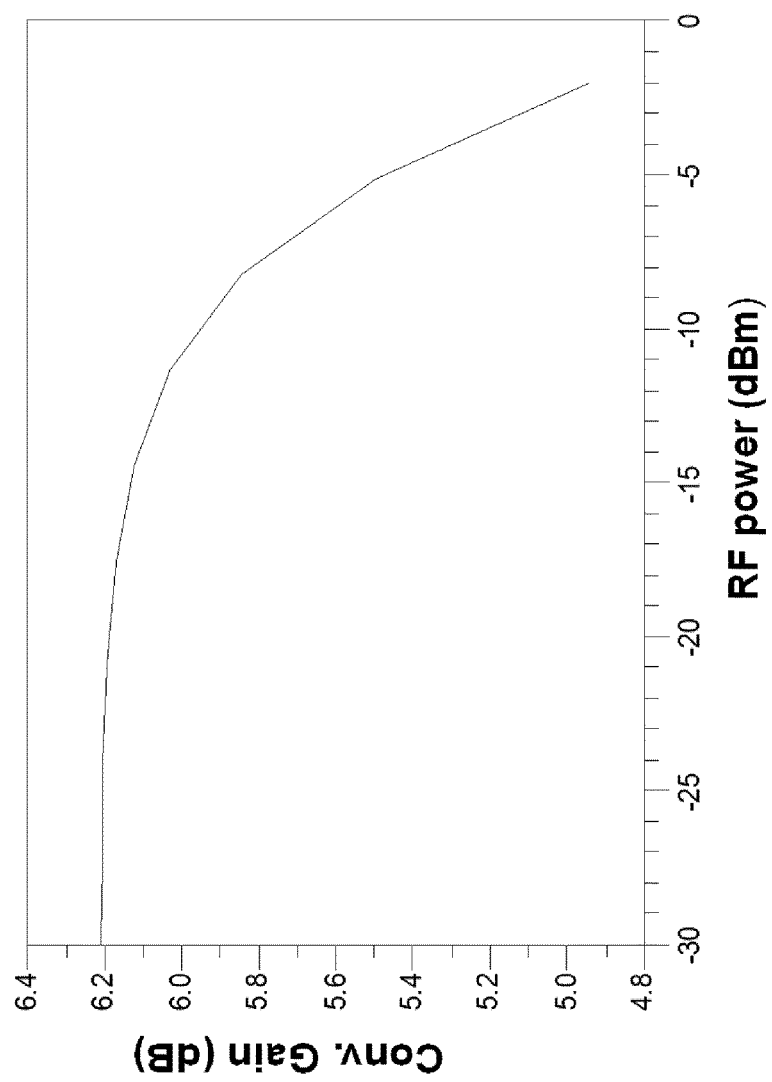
FIG. 7 is a diagram showing conversion gain versus input RF signal power for the sub-harmonic mixer shown in FIG. 3.

In order to know the linearity of the sub-harmonic mixer 300 according to embodiments herein, the conversion gain as a function of the input RF signal power is shown in FIG. 7, where $f_{IF}$=1 GHz, $f_{LO}$=30 GHz and $f_{RF}$=151 GHz and the LO signal power is 1.5 dBm. It can be seen that, the sub-harmonic mixer 300 has a 1 dB compression point of −3 dBm. This result demonstrates that the sub-harmonic mixer 300 according to embodiments herein has a good linearity.

Figure 8:
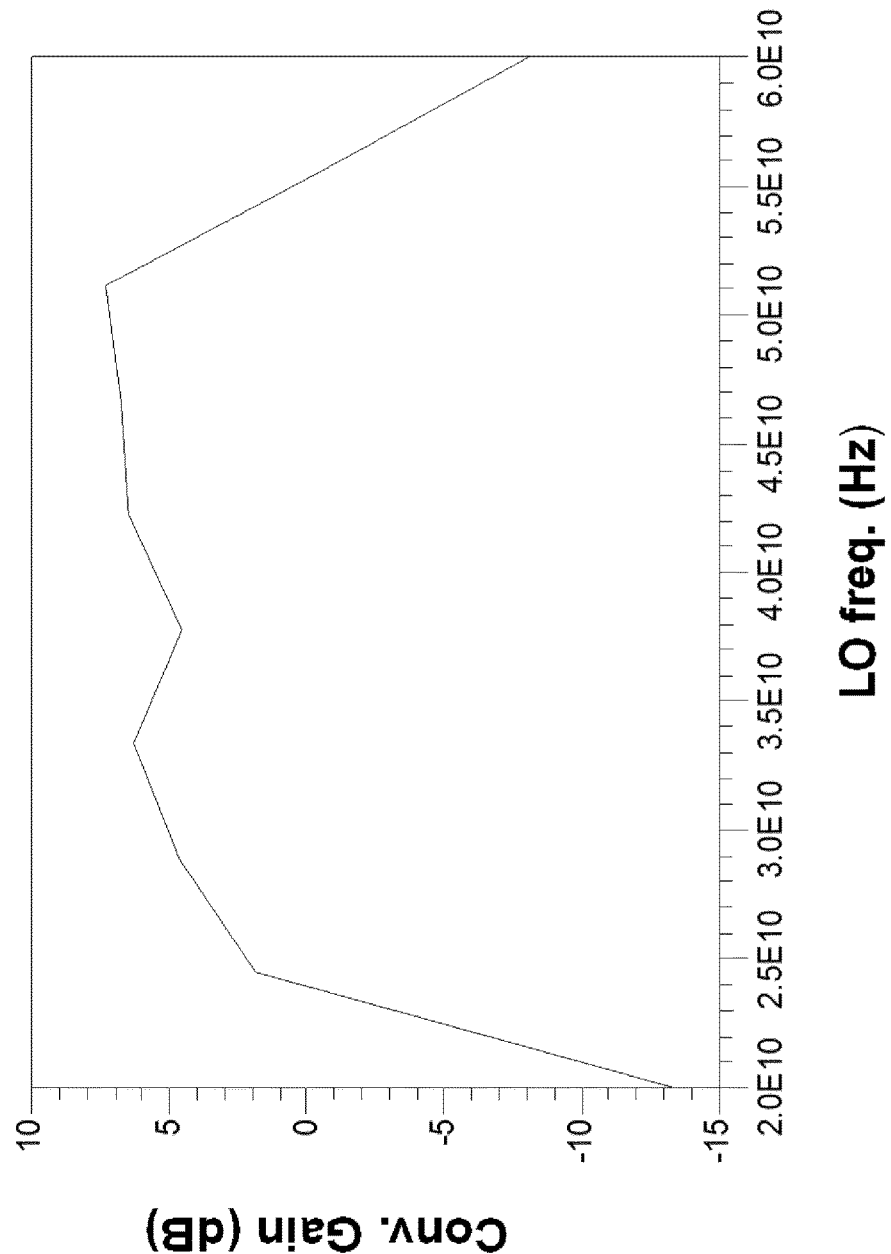
FIG. 8 is a diagram showing conversion gain versus LO signal frequency for the sub-harmonic mixer shown in FIG. 3.

The sub-harmonic mixer 300 according to some example embodiments herein has a broad bandwidth for the LO and RF signals. To demonstrate this, the conversion gain as a function of the LO signal frequency is shown in FIG. 8, where the IF signal frequency is fixed at 1 GHz, the LO signal power is 1.5 dBm. It can be seen that, as the LO signal frequency is swept from 23 GHz to 55 GHz, the corresponding RF signal frequency is from 116 GHz to 276 GHz, the conversion gain of the sub-harmonic mixer 300 is larger than 0 dB, and the maximum conversion gain is 7.3 dB at the LO signal frequency of 51.1 GHz and the RF signal frequency of 256.5 GHz. This result shows that the sub-harmonic mixer herein has a broad bandwidth.

The sub-harmonic mixer 300 according to some example embodiments herein has flexibility of operating with different LO harmonic signals for converting RF signals having different frequencies to an IF signal. In other word, it is a multi-band sub-harmonic mixer. Namely, for a given IF signal frequency, the sub-harmonic mixer 300 can work at different RF signal frequencies, $f_{RF}=f_{IF}+nf_{LO}$, where n=4, 5, 6, 7, 8, which represents the different order of the LO harmonics. For example, the conversion gain versus RF signal frequency is simulated and the results are listed in Table 1 for different LO harmonics, where the LO signal frequency is fixed at 30 GHz with a power of 1.5 dBm, the RF signal has a power of −20 dBm and the desired IF signal frequency is 1 GHz. It can be seen that the sub-harmonic mixer 300 herein has a decent conversion gain when operating with the LO harmonics from the 4th to the 7th order. However, as the sub-harmonic mixer operates with the 8th order LO harmonic, the conversion gain drops to −2.5 dB.

TABLE 1

Conversion gain at different order of LO harmonic

| RF freq. (GHz) | 121 | 151 | 181 | 211 | 241 |
|---|---|---|---|---|---|
| n-th LO har. | ×4 | ×5 | ×6 | ×7 | ×8 |
| Conv. Gain (dB) | 7.6 | 6.2 | 3.7 | 7.7 | −2.5 |

The sub-harmonic mixer 300 according to embodiments herein also has a low DC power consumption. For example, it operates at a collector supply voltage of 1.8V with a DC current of 30 mA. The total DC power consumption is 54 mW.

In summary, the sub-harmonic mixer 300 according to embodiments herein has following advantages:
1. It is a high-order sub-harmonic mixer which can operate with the LO harmonics up to the 7th order;
2. It is a multi-band sub-harmonic mixer which is able to operate at different LO harmonics and at different RF signal frequencies;
3. It has a broad bandwidth for RF and LO signals;
4. It has positive conversion gain for n=4, 5, 6, 7;
5. It operates with low LO signal power;
6. Baluns and 90 hybrids are not needed and there are not any filters between stages.

Figure 9:
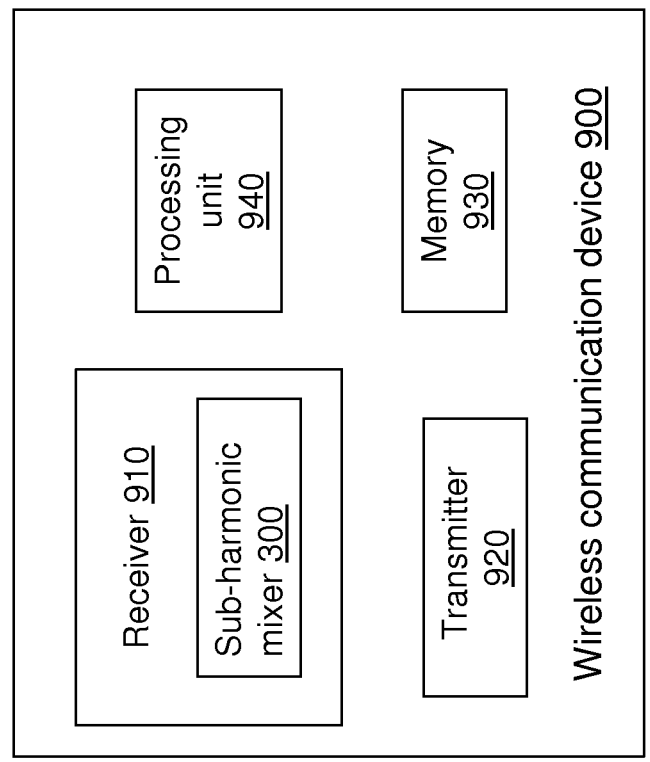

The sub-harmonic mixer 300 according to embodiments herein is suitable for millimeter/macro wave receivers for receiving, for example, E-band and 145 GHz RF signals in a wireless communication device 900 as shown in FIG. 9. The wireless communication device 900 comprises a Receiver 910, wherein the sub-harmonic mixer 300 may be implemented in. The wireless communication device 900 further comprises a Transmitter 920, a Memory 930 and a Processing unit 940.

Those skilled in the art will understand that although transistors $Q_1$, $Q_2$ and $Q_3$ in the sub-harmonic mixer 300 as shown in FIG. 3 are Bipolar Junction Transistors (BJT), the sub-harmonic mixer 300 may comprise any other types of transistors, such as Field-Effect Transistor (FET), Metal-Oxide-Semiconductor FET (MOSFET), Junction FET (JFET), Metal-semiconductor FETs (MESFETs) etc. When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. A sub-harmonic mixer for converting a Radio Frequency, RF, signal to an Intermediate Frequency, IF, signal, the sub-harmonic mixer comprising:
   a Local Oscillator, LO, input to receive an LO signal;
   an RF input to receive the RF signal;
   an IF output to output the IF signal; and
   a circuit comprising three or more cascaded stages, wherein
      each stage having an input and an output, the output of each stage is coupled to the input of a next stage by a capacitor;
      each stage comprising a common-emitter transistor having a base, a collector and an emitter, or a common-source transistor having a gate, a drain and a source;
      the input of each stage is at the base or gate of the transistor, the output of each stage is at the collector or drain of the transistor;
      an Alternating Current, AC, choke is coupled at the collector or drain of each transistor; and
      the emitter or source of each transistor is connected to a ground; and
   wherein
      the LO input is coupled to the input of a first stage of the three or more stages;
      the RF input is coupled to the output of the first stage of the three or more stages; and
      the IF output is coupled to the output of a last stage of the three or more stages.

2. The sub-harmonic mixer according to claim 1, wherein the RF input is coupled to the output of the first stage of the three or more stages through a high pass filter (340).

3. The sub-harmonic mixer according to claim 1, wherein the IF output is coupled to the output of a last stage of the three or more stages through a low-pass filter and matching network.

4. The sub-harmonic mixer according to claim 1, wherein the base or gate of each transistor is coupled to a respective Direct Current, DC, supply through a resistor.

5. The sub-harmonic mixer according to claim 1, wherein the LO input is coupled to the input of a first stage of the three or more stages through a capacitor.

6. The sub-harmonic mixer according to claim 1, wherein the sub-harmonic mixer is a multi-band sub-harmonic mixer operating with different LO harmonic signals for converting RF signals having different frequencies to an IF signal.

7. The sub-harmonic mixer according to claim 6, wherein different LO harmonic signals comprise LO harmonics from 4th up to 7th order.

8. The sub-harmonic mixer according to claim 1, wherein the sub-harmonic mixer is situated in a wireless communication device.

9. A method in a sub-harmonic mixer for converting a Radio Frequency, RF, signal to an Intermediate Frequency, IF, signal, wherein the sub-harmonic mixer comprises a circuit having three or more cascaded stages each stage having an input and an output, the output of each stage is coupled to the input of a next stage by a capacitor; the method comprising:
   receiving a Local Oscillator, LO, signal at an input of a first stage of the three or more cascaded stages;
   receiving the RF signal at an output of the first stage;
   amplifying the LO signal and generating LO harmonic signals in the first stage;
   generating a first IF signal by mixing the RF signal with one of generated LO harmonic signal in the first stage;
   amplifying the generated first IF signal in stages of the three or more cascaded stages following the first stage;
   generating a second IF signal by mixing the RF signal with one of the generated LO harmonic signal in the stages of the three or more cascaded stages following the first stage;
   generating the IF signal by combining the amplified first IF signal and the generated second IF signal at an output of a last stage of the three or more cascaded stages; and
   outputting the generated IF signal to an IF output.

10. The method according to claim 9, wherein receiving the RF signal at the output of the first stage comprises receiving the RF signal at the output of the first stage through a high pass filter.

11. The method according to claim 9, wherein outputting the generated IF signal to the IF output comprises outputting the generated IF signal to the IF output through a low-pass filter and matching network.

12. The method according to claim 9, wherein receiving a Local Oscillator, LO, signal at an input of a first stage of the three or more cascaded stages comprises receiving the LO signal at the input of the first stage through a third capacitor.

13. The method according to claim 9, wherein the sub-harmonic mixer is a multi-band sub-harmonic mixer operating with different LO harmonic signals for converting RF signals having different frequencies to an IF signal.

14. The method according to claim 13, wherein different LO harmonic signals comprise LO harmonics from 4th up to 7th order.

* * * * *